(12) United States Patent
Nakamura et al.

(10) Patent No.: US 7,252,167 B2
(45) Date of Patent: Aug. 7, 2007

(54) ELECTRICAL APPARATUS, COOLING SYSTEM THEREFOR, AND ELECTRIC VEHICLE

(75) Inventors: Takayoshi Nakamura, Hitachi (JP); Akihiro Tamba, Hitachinaka (JP); Ryuichi Saito, Hitachi (JP); Atsuo Nishihara, Kashiwa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/476,629

(22) Filed: Jun. 29, 2006

(65) Prior Publication Data

US 2006/0243504 A1    Nov. 2, 2006

Related U.S. Application Data

(63) Continuation of application No. 10/803,929, filed on Mar. 19, 2004, now Pat. No. 7,090,044, which is a continuation of application No. 10/417,339, filed on Apr. 17, 2003, now Pat. No. 6,978,856.

(30) Foreign Application Priority Data

Apr. 18, 2002    (JP) .............................. 2002-116274

(51) Int. Cl.
  *H05K 7/20* (2006.01)
(52) U.S. Cl. ..................... 180/68.4; 257/714; 257/722; 361/699; 361/701; 361/703
(58) Field of Classification Search ............... 180/68.4; 257/714, 722, 717; 361/688, 689, 699, 701, 361/702, 703
  See application file for complete search history.

(56) References Cited

U.S. PATENT DOCUMENTS

| | | | |
|---|---|---|---|
| 5,126,919 A | 6/1992 | Yamamoto et al. ......... 361/700 |
| 5,203,399 A * | 4/1993 | Koizumi ................ 165/104.33 |
| 5,713,413 A | 2/1998 | Osakabe et al. ....... 165/104.33 |
| 6,140,571 A | 10/2000 | Kitahara et al. ........... 174/16.3 |
| 6,501,654 B2 * | 12/2002 | O'Connor et al. .......... 361/699 |
| 6,542,365 B2 * | 4/2003 | Inoue ........................ 361/699 |
| 6,578,626 B1 * | 6/2003 | Calaman et al. ........... 165/80.4 |
| 6,611,057 B2 | 8/2003 | Mikubo et al. ............. 257/714 |
| 6,889,516 B2 * | 5/2005 | Sasaki et al. .............. 62/259.2 |
| 6,898,072 B2 * | 5/2005 | Beihoff et al. .............. 361/676 |
| 6,903,929 B2 * | 6/2005 | Prasher et al. .............. 361/699 |
| 6,978,856 B2 * | 12/2005 | Nakamura et al. ......... 180/68.4 |
| 7,027,302 B2 * | 4/2006 | Inoue ........................ 361/699 |
| 7,090,044 B2 * | 8/2006 | Nakamura et al. ......... 180/65.8 |
| 7,106,592 B2 * | 9/2006 | Inoue et al. ................ 361/704 |
| 2004/0020231 A1 * | 2/2004 | Nakamura et al. ......... 62/259.2 |
| 2004/0173392 A1 * | 9/2004 | Nakamura et al. ......... 180/65.1 |
| 2006/0120047 A1 * | 6/2006 | Inoue ........................ 361/699 |
| 2006/0243504 A1 * | 11/2006 | Nakamura et al. ......... 180/68.1 |
| 2007/0045801 A1 * | 3/2007 | Sugiyama et al. .......... 257/684 |

FOREIGN PATENT DOCUMENTS

JP    10-22428    1/1998

* cited by examiner

*Primary Examiner*—Jeff Restifo
(74) *Attorney, Agent, or Firm*—Crowell & Moring LLP

(57) ABSTRACT

An inverter apparatus includes a liquid path in which cooling water flows, and in which the cooling water performs cooling at a cooling part located directly underneath the power circuit part of the inverter apparatus. The liquid path includes a first partial structure part formed between a feed pipe and the cooling part, and having a liquid path cross-sectional profile that is gradually reduced in the short-side direction of the cooling part and that is gradually enlarged in the long-side direction thereof; and a second partial structure part formed between the cooling part and a drain pipe, and having a liquid path cross-sectional profile that is gradually enlarged from the short-side of the cooling part and that is gradually reduced from the long-side thereof.

10 Claims, 13 Drawing Sheets

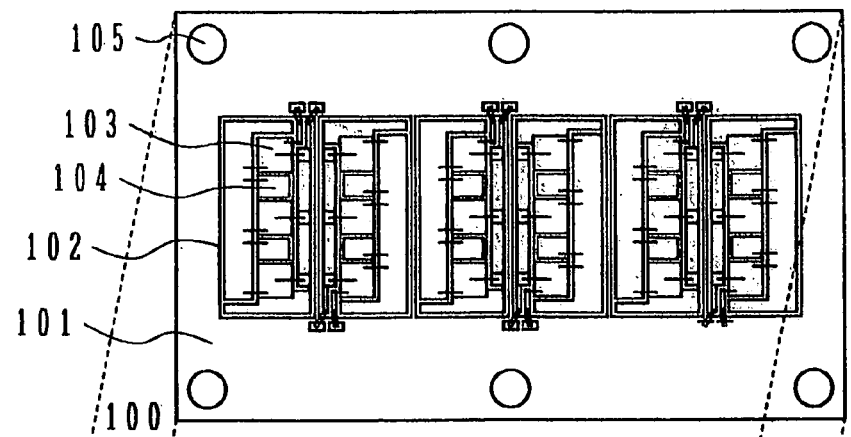
FIG.1A
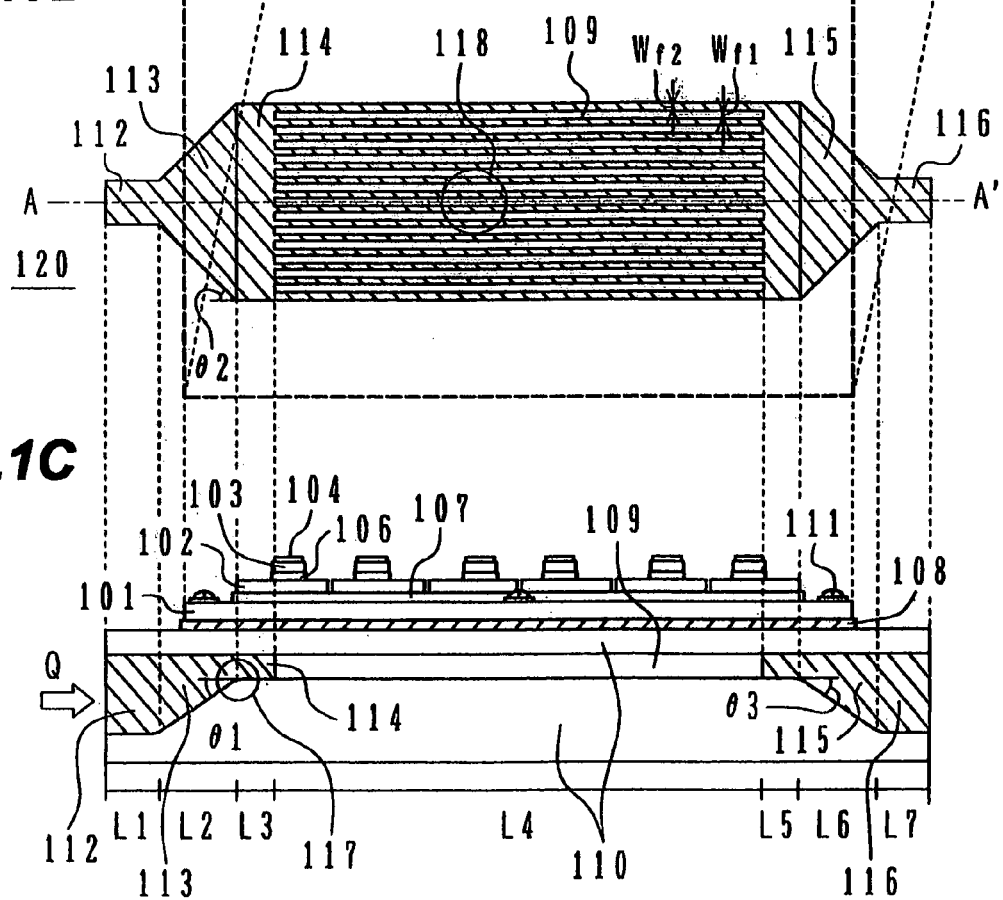
FIG.1B
FIG.1C

FIG.8A
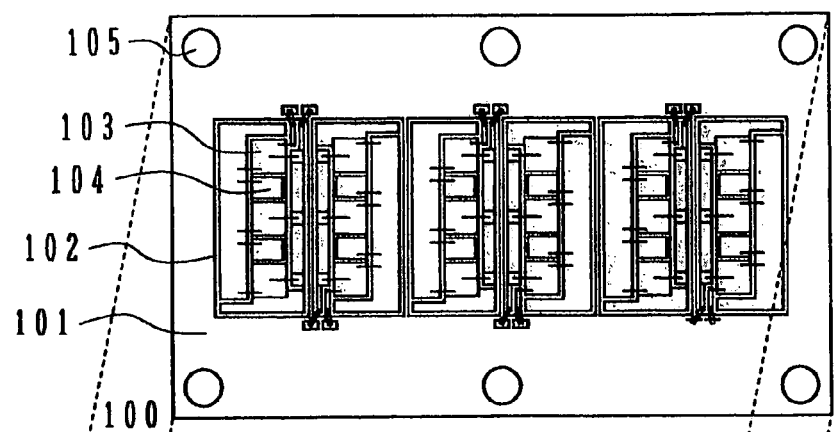
FIG.8B
FIG.8C
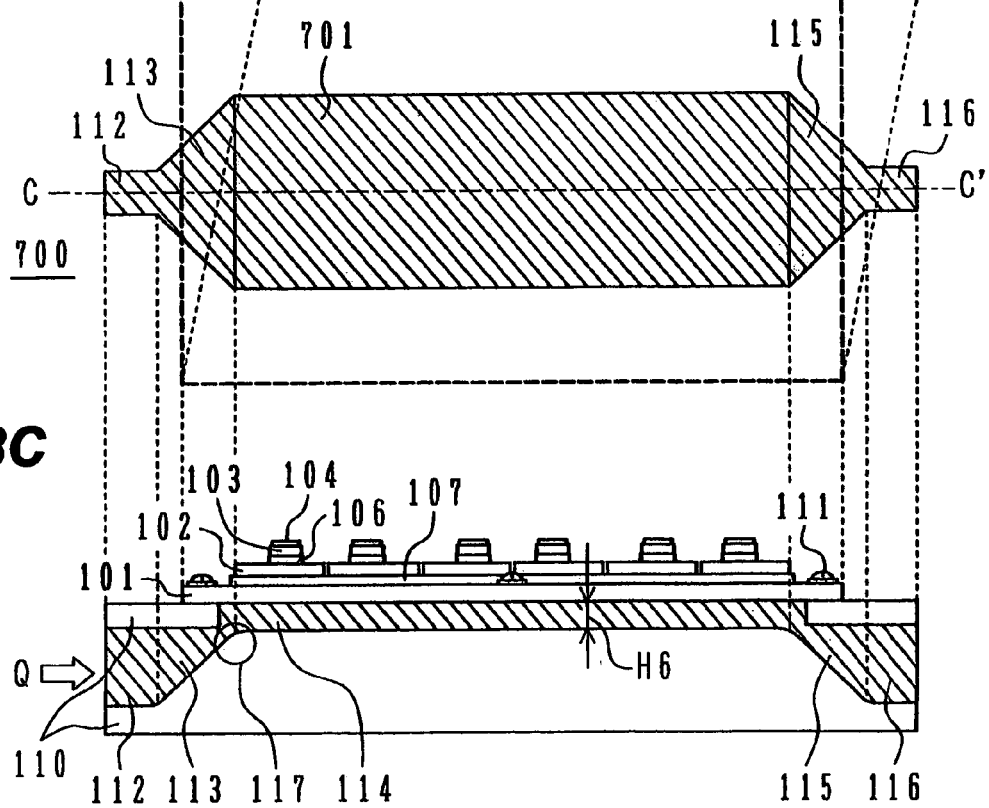

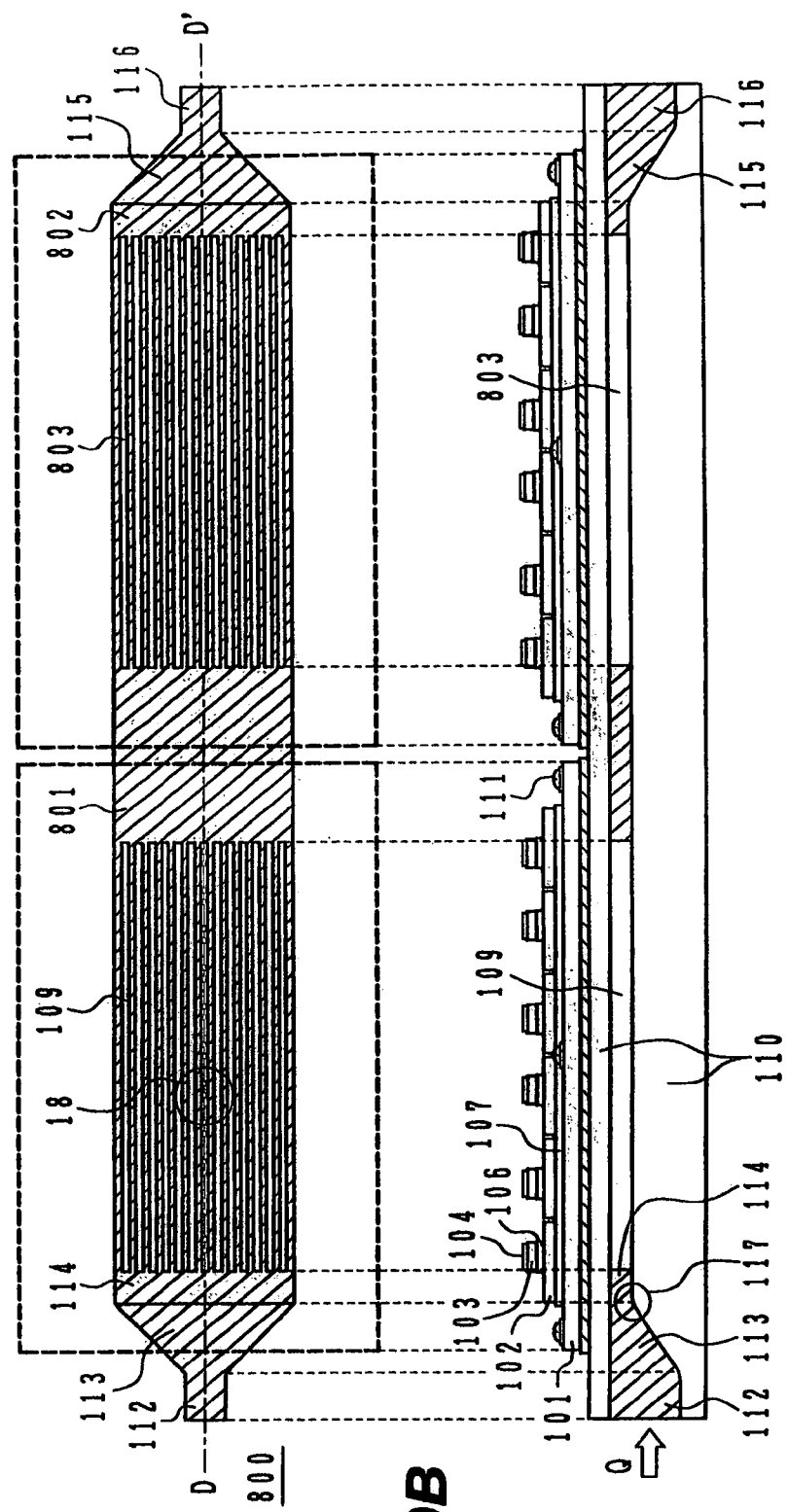

ELECTRICAL APPARATUS, COOLING SYSTEM THEREFOR, AND ELECTRIC VEHICLE

This application is a continuation of U.S. patent application Ser. No. 10/803,929, filed Mar. 19, 2004 now U.S. Pat. No. 7,090,044, which is a continuation of U.S. patent application Ser. No. 10/417,339, filed Apr. 17, 2003, now U.S. Pat. No. 6,978,856.

BACKGROUND OF THE INVENTION

1. Field of the Invention

The present invention relates an electrical apparatus, a cooling system therefor, and electric vehicle inverter apparatus, and more particularly to an inverter apparatus characterized by the liquid path structure in the power circuit part in a liquid-cooling inverter.

2. Description of the Related Art

As an example of a conventional electric apparatus having a liquid path including a space for allowing a cooling medium for cooling a heating member to flow therein, for example, a conventional liquid-cooling inverter, an inverter as shown in FIG. 8 in JP-A 10-22428, is known in which a plurality of rows of fins is formed on the surface of a module's substrate adjacent to a cooling medium chamber, in which the fin rows are arranged with the direction from the inlet of the cooling medium flow toward the outlet thereof being the longitudinal direction, and in which the fins are formed as a contiguous sequence of fins in the flow direction of the cooling medium. In such a case, it is also known that, because the width of the cooling medium chamber is wide with respect to that of the cooling medium flow inlet, an accumulating part for the cooling medium is formed between the cooling medium flow inlet and the cooling medium chamber, in order to ensure a uniform flow rate of the cooling medium in the cooling medium chamber for achieving uniform cooling.

SUMMARY OF THE INVENTION

However, according to the examination by the present inventors, of the structure disclosed in the JP-A 10-22428, it was found that this structure involves a problem of increasing the loss of pressure in the liquid path thereof. Specifically, the structure set forth in the JP-A 10-22428 is one in which the depth of liquid path in the fin rows is less than that in the cooling medium flow inlet. In addition, respective accumulating parts are provided between the inlet liquid path and the liquid path in the fin rows, and between the liquid path in the fin rows and the outlet liquid path. Therefore, in the respective accumulating parts, the liquid path depth steeply changes between the inlet liquid path and the liquid path in the fin rows, thereby causing a loss of pressure, and likewise, the liquid path depth steeply changes between the liquid path in the fin rows and the outlet liquid path, thereby incurring a pressure loss. These pressure losses increase the load on a pump for feeding the cooling medium into the liquid path. This raises a problem of increasing the size of the pump.

Accordingly, it is an object of the present invention to provide an inverter apparatus having a liquid path structure that allows uniform cooling without the need for accumulating parts to thereby improve the thermal characteristic, and that reduces the loss of pressure in the liquid path.

The present invention provides an electric apparatus having a flow structure for allowing uniform cooling to be achieved without the need for accumulating parts, thereby improving thermal characteristic, and also enables the pressure loss in the parts other than the cooling part to be reduced. Further, the present invention provides a cooling system and an electric vehicle for the electrical apparatus.

To achieve the above-described object, the present invention provides an inverter apparatus having a liquid path comprising a space for allowing a cooling medium to flow therein, and a feed pipe and a drain pipe for allowing the cooling medium to enter into and drain out of the space, respectively. This liquid path includes a cooling part disposed immediately underneath the heating part in the power circuit part of the inverter apparatus; a first partial structure part disposed between the feed pipe and the cooling part, and having a liquid path cross-sectional profile that is gradually reduced in the short side direction of the cooling part and that is gradually enlarged in the long side direction thereof; and a second partial structure part disposed between the cooling part and the drain pipe, and having a liquid path cross-sectional profile that is gradually enlarged from the short side of the cooling part and that is gradually reduced from the long side thereof.

By virtue of these features, the present invention allows uniform cooling to be achieved without the need for accumulating parts, thereby improving thermal characteristic, and also enables the pressure loss in the parts other than the cooling part to be reduced.

In the inverter apparatus according to the present invention, it is preferable that each of the first and second partial structure parts be constant in the rate of change of the length in the short side, and that each of the first and second partial structure parts be constant in the rate of change of the length in the long side.

In the inverter apparatus according to the present invention, it is preferable that the first and second partial structure parts and the feed and drain pipes be parallel with the cooling part, and that the angle formed between the peripheral wall of the cooling part and that of each of the partial structure parts be not more than 45 degrees.

In the inverter apparatus according to the present invention, preferably, the angle $\theta 1$ formed between the peripheral wall of the first partial structure part and that of the cooling part is smaller than the angle $\theta 3$ formed between the peripheral wall of the second partial structure part and that of the cooling part.

In the inverter apparatus according to the present invention, preferably, each of the feed pipe and drain pipe is perpendicular to the cooling part.

In the inverter apparatus according to the present invention, it is preferable that the feed pipe and drain pipe be located on the same side with respect to the inverter apparatus, wherein the angle $\theta 5$ formed between the peripheral wall of the feed pipe and that of the first partial structure part is not more than 45 degrees, and that the angle $\theta 6$ formed between the peripheral wall of the first partial structure part and that of the cooling part be less than 90 degrees.

In the inverter apparatus according to the present invention, preferably, a plurality of inverter apparatuses is arranged on the same plane.

Further objects, features and advantages of the present invention will become apparent from the following description of the preferred embodiments with reference to the attached drawings.

BRIEF DESCRIPTION OF THE DRAWINGS

FIG. 1A is a plan view showing a module of an inverter apparatus according to a first embodiment of the present invention, FIG. 1B is a perspective plan view showing the liquid path part of this inverter apparatus, and FIG. 1C is a sectional view showing the overall construction of the inverter apparatus;

FIG. 8A is a plan view showing a module of an inverter apparatus according to a fourth embodiment of the present invention, FIG. 8B is a perspective plan view showing the liquid path part of this inverter apparatus, and FIG. 8C is a sectional view showing the overall construction of the inverter apparatus;

FIG. 9A is a perspective plan view showing the liquid path part of an inverter apparatus according to a fifth embodiment of the present invention, and FIG. 9B is a sectional view showing the overall construction of this inverter apparatus;

DESCRIPTION OF THE PREFERRED EMBODIMENTS

Figure 2:
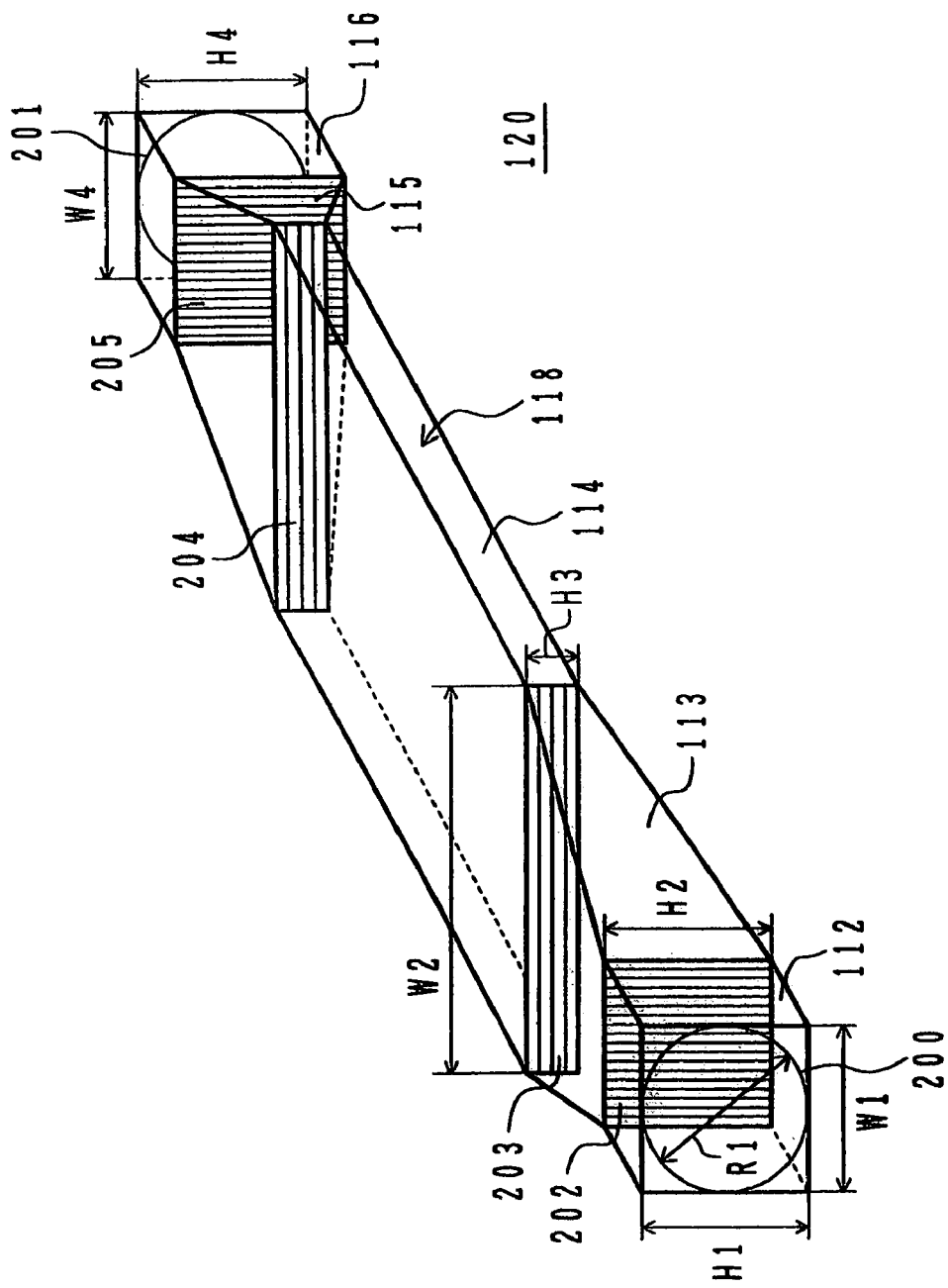
FIG. 2 is a perspective view showing the configuration of the liquid path in the inverter apparatus according to the first embodiment.

The construction of an inverter apparatus according to an first embodiment of the present invention will be described below in connection with FIGS. 1 to 5.

First, references will be made to the overall construction of the inverter apparatus according to the first embodiment with reference to FIG. 1. The liquid-cooling inverter according to this embodiment is used as an on-board inverter for vehicles such as vehicles contributing environmental safeguard.

FIG. 1A is a plan view showing a module with six arms (upper and lower arms in each of the U, V, and W phases) of the inverter apparatus according to the first embodiment of the present invention, and FIG. 1B is a perspective plan view showing the liquid path part of this inverter apparatus. FIG. 1C is a sectional view showing the overall construction of the inverter apparatus, the sectional view being taken along the line A-A' in FIG. 1B.

As shown in FIG. 1A, the module 100 includes semiconductor chips 103 and 104, substrates 102, and a copper base 101. Each of the semiconductor chips 103 and each of the semiconductor chips 104 are typically constituted of an IGBT (Insulated Gate Bipolar Transistor) and an FWD (Free Wheeling Diode), respectively. The inverter apparatus converts direct-current power supplied by a direct-current power source, such as a battery, into alternating-current power, and supplies the obtained alternating-current power to an electric motor to drive it, with the semiconductor chips 103 thereof performing a function of switching by PWM (Pulse Width Modulation) control or the like.

In the illustrated example, six substrates 102 are mounted on the copper base 101, thereby constituting 6 arm module. Three semiconductor chips 103 and two semiconductor chips 104 are mounted on each of the substrates 102. The planar size of the substrate 102 is, e.g., approximately 27 mm □ 55 mm. The planar size of the semiconductor chip 103 is, e.g., approximately 9 mm square. The planar size of the semiconductor chip 104 is, e.g., approximately 6 mm square. The substrate 102 is formed by solder-brazing a copper foil over each of the front and rear surfaces of an aluminum nitride plate.

As shown in FIG. 1C, the semiconductor chips 103 and 104 are mounted on each of the substrates 102 via solder 106. Each of the substrate 102 is mounted on the copper base 101 via solder 107. The planar size of the copper base 101 is, e.g., approximately 100 mm □ 230 mm. Screw holes 105 for screwing are formed in the copper base 101, and the size of the screw hole is approximately M6. Using screws 111, the module 100 is fastened, via grease, to the case 110 formed by aluminum die-casting.

As illustrated in FIG. 1C, a liquid path 120 indicated by hatching is formed within the case 110. The liquid path 120 has a shape as shown in FIGS. 1C and 1B. As shown in FIG. 1C, in the central part of the case 110, fins 109 integrally formed with the case 110 are provided at the part (referred to as a "cooling part") below the place where the semiconductor chips 103 and 104 are mounted.

As shown in FIG. 1B, the fins 109 are formed in parallel with the longitudinal direction of the liquid path 120. In the illustrated sample, there are provided thirteen fins 109 parallel with one another. The width Wf1 of each of the fins is, e.g., 2.5 mm.

As illustrated in FIG. 1B, the module 100 is installed into the liquid path at the location indicated by thick dotted lines. The module 100 is cooled by supplying an LLC (Long Life Coolant), which is cooling-water, from an electric water pump (not shown) to the liquid path 120. The maximum flow rate of the electric water pump is 20 liters per minute, and the maximum pressure loss thereof is approximately 14 kPa.

A feed tube to be connected to a radiator is connected to the left end of the liquid path 120. The liquid path 120 comprises a feed pipe 112, partial structure pipe 113, cooling part 114, partial structure pipe 115, and drain pipe 116. An inter-fin liquid path 118 is formed in the central part of the cooling part 114. A drain tube to be connected to the radiator is connected to the right end of the water drain pipe 116.

The configuration of the liquid path 120 will be further described with reference to FIG. 2.

FIG. 2 is a perspective view showing the configuration of the liquid path in the inverter apparatus according to the first embodiment.

A feed tube to be connected to the radiator is connected to the feed pipe inlet 200. The diameter R1 of the feed pipe inlet 200 is, e.g., 17 mm. The feed pipe 112 has a quadrangular prism shape. The height H1 thereof is, e.g., 17 mm, the width W1 thereof is, e.g., 17 mm, and the length L1 thereof is, e.g., 10 mm.

The liquid path cross-sectional profile in the partial structure pipe 113 extending from the feed pipe 112 up to the cooling part 114, substantially has a shape that is gradually reduced in the short side direction of the cooling part 112, that is gradually enlarged in the long side direction thereof, and that connects the feed pipe 112 and the cooling part 114. Namely, the partial structure pipe 113 is configured to gradually widen from the liquid path cross-section 202 up to the liquid path cross-section 203 in the direction of the liquid path width (long side), and gradually narrow in the direction of the liquid path depth (short side). The width of the liquid path cross-section 202 is equal to the width W1, and it is, e.g., 17 mm. The width W2 of the liquid path cross-section 203 is, e.g., 60 mm. The length L2 of the partial structure pipe 113 is, e.g., 23 mm. The rate of change in expansion of the partial structure pipe 113 in the liquid path width direction and the rate of change in reduction in the liquid path depth direction are each substantially constant. The angle of the partial structure pipe 113 decreasing in the liquid path depth direction, that is, the angle θ1 formed between the peripheral wall of the cooling part 114 and that of the partial structure pipe 113, is 30 degrees. It is desirable that this angle θ1 be not more than 45 degrees in order to reduce the loss of pressure. On the other hand, the angle of the partial structure pipe 113 increasing in the liquid path width direction, that is, the angle θ2 formed between the peripheral wall of the cooling part 114 and that of the partial structure pipe 113, is 30 degrees. It is desirable that this angle θ2 be not more than 45 degrees in order to reduce the pressure loss.

In the cooling part 114, there is provided the inter-fin liquid path 118 having therein fins 109 integrally molded with the case 110. The fin width Wf1 of each of the fins 109 is, e.g., 2.5 mm, the spacing Wf2 between adjacent fins is, e.g., 2 mm and the fin height is, e.g., 5 mm. When the flow rate is 20 liters per minute, the flow speed in the inter-fin liquid path 118 is approximately 2.5 m/s. The length L4 of the inter-fin liquid path 118 is, e.g., 150 mm, and each of the lengths L3 and L5 of the portions of the cooling part 114, located before and after the inter-fin eater path is, e.g., 10 mm.

The LLC passed through the fins 109 is narrowed in the partial structure pipe 115 in the liquid path width direction, from the liquid path cross-section 204 up to the liquid path cross-section 205, at an angle of 30 degrees, and it is gradually widened in the liquid path depth direction. Furthermore, the LLC flows from the drain pipe 116 toward the drain pipe outlet 201 with a diameter of 17 φ. It is desirable that the angle of the partial structure pipe 115 increasing in the liquid path depth direction be not more than 45 degrees. The length L6 of the partial structure pipe 115 is, e.g., 23 mm. The width and height of the liquid path cross-section 204 are made equal to those of the liquid path cross-section 203, and the width and height of the liquid path cross-section 205 are made equal to those of the liquid path cross-section 202. The width W4 of the drain pipe 116 is, e.g., 17 mm, and the height H4 thereof is, e.g., 17 mm.

In order to reduce the loss of pressure in the liquid path, it is desirable that the angle θ1 formed by the partial structure pipe 113 and the cooling part, be smaller than the angle θ3 formed by the partial structure pipe 115 and the cooling part. Specifically, in the above-described example, the angle θ1 is 30 degrees and the angle θ3 is also 30 degrees, but it is desirable to change the angle θ1 into, e.g., 20 degrees. Thereby, the loss of pressure can be more reduced although the entire length of the liquid path lengthens. When attempting to reduce the entire length of the liquid path, with the angle θ1 as well as the angle θ3 being 30 degrees, it is recommended that the angle θ3 is changed into 40 degrees. This would reduce the length of the liquid path and allow the size-reduction of the inverter apparatus, although the loss of pressure slightly increases.

Meanwhile, because the case 110 is a casting, each of the corners thereof has a rounded corner with approximately 1 mm radius of curvature, and also the case 110 actually has a gradient of a few degrees for chamfering.

Here, the structure of the liquid path in the conventional example will be described with reference to FIG. 3.

Figure 3:
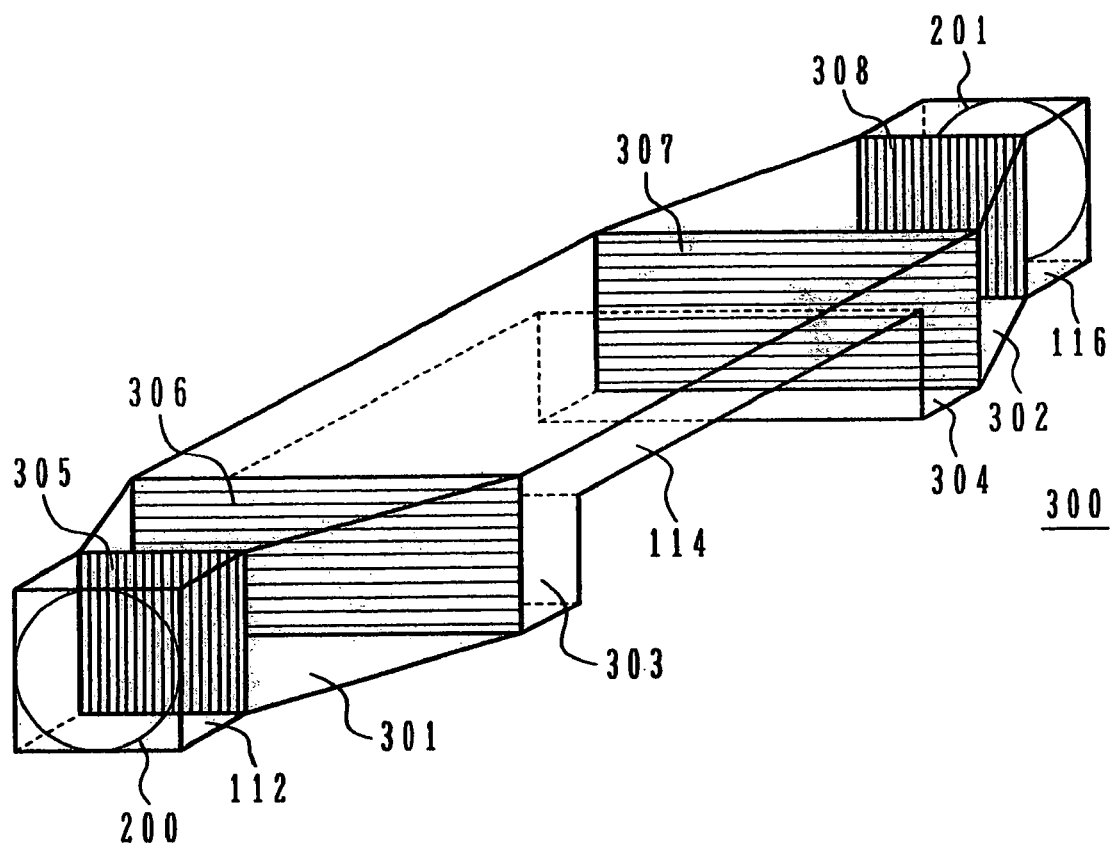
FIG. 3 is a perspective view showing the configuration of the liquid path in a conventional example.

FIG. 3 is a perspective view showing the configuration of the liquid path in the conventional example.

The liquid path 300 having the liquid path structure shown in FIG. 3 enters from a feed pipe inlet 200 into a partial structure part 301 through a liquid path inlet 112.

From a liquid path cross-section 305 up to a liquid path cross-section 306, the liquid path 300 widens in the liquid path width direction, but it does not change in the liquid path depth direction. Likewise, with regard to the drain pipe side, from a liquid path cross-section 307 up to a liquid path 308, the liquid path 300 narrows in the liquid path width direction, but it does not change in the liquid path depth direction. On the feed pipe side, there exists an accumulating part 303 between a partial structure part 301 and a cooling part 114. Similarly, on the drain pipe side, there exists an accumulating part 304 between the cooling part 114 and a partial structure part 302. The LLC passes through the partial structure part 302 and the drain pipe 116, and is drained from the drain pipe outlet 201.

Next, with reference to FIGS. 4A and 4B, variations in the liquid path cross-sectional area when the liquid path structure according to the first embodiment of the present invention is used, will be described in comparison with the conventional example.

Figure 4A:
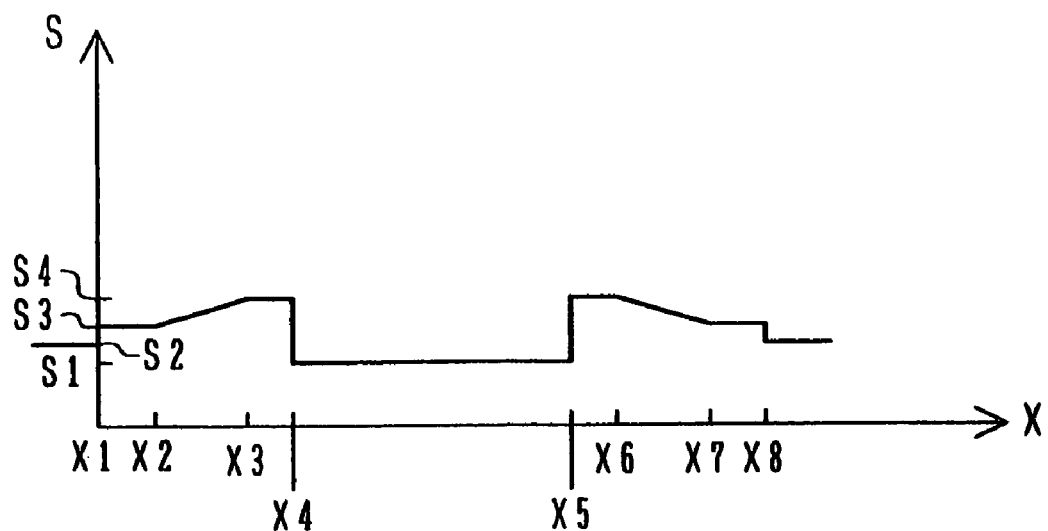
FIG. 4A is a diagram showing variations in the liquid path cross-sectional area of the liquid path structure used in the inverter apparatus according to the first embodiment of the present invention.
Figure 4B:
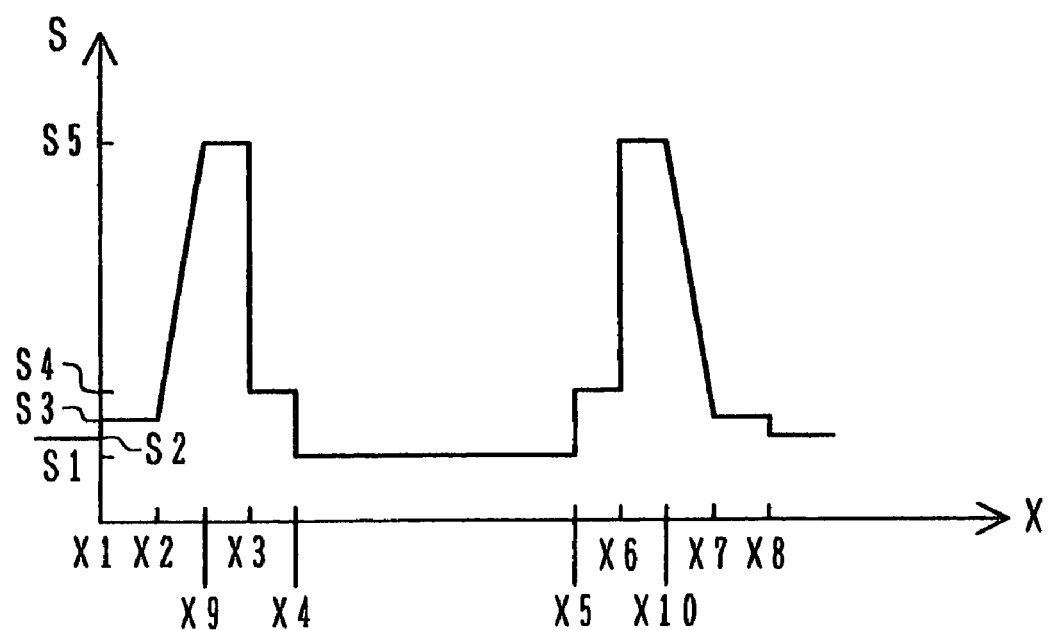
FIG. 4B is a diagram showing variations in the liquid path cross-sectional area in the conventional example.

FIG. 4A is a diagram showing variations in the liquid path cross-sectional area of the liquid path structure used in the inverter apparatus according to the first embodiment of the present invention, and FIG. 4B is a diagram showing variations in the liquid path cross-sectional area in the conventional example.

In FIG. 4A, the abscissa axis denotes a position X of the liquid path 120 in the longitudinal direction. The ordinal axis denotes a liquid path cross-sectional area S. In FIG. 4A, a position x1 denotes the position of the feed pipe inlet 200 shown in FIG. 2. When the liquid path cross-sectional profile changes from 17 φ into 17 mm square at the position x1, the liquid path cross-sectional area steeply changes from S2 (227 mm²) into S3 (289 mm²). A position x2 denotes the position of a liquid path cross-section 202 in FIG. 2. A position x3 denotes the position of a liquid path cross-section 203 shown in FIG. 2. In the range from the position x2 to the position x3, the liquid path cross-sectional area gradually changes from S3 (289 mm²) into S4 (300 mm²) because the partial structure pipe 113 is employed here. The range from a position x4 to a position x5 denote the positional range where the inter-fin liquid path 118 is formed. At the position x4, the liquid path cross-sectional area steeply changes from S4 (300 mm²) into S1 (150 mm²). A position x6 denotes the position of the liquid path cross-section 204 in FIG. 2, and a position x7 denotes the position of the liquid path cross-section 205 in FIG. 2. In the range from the position x6 to the position x7, the liquid path cross-sectional area gradually changes from S4 (300 mm²) into S3 (289 mm²) because the partial structure pipe 115 is employed here. A position x8 denotes the position of the drain pipe outlet 201 in FIG. 2. When the liquid path cross-sectional profile changes from 17 mm square into 17 φ at the position x8, the liquid path cross-sectional area steeply changes from S3 (289 mm²) into S2 (227 mm²).

In FIG. 4B, a position x2 denotes the position of a liquid path cross-section 305 shown in FIG. 3. A position x9 denotes a position of a liquid path cross-section 306 in FIG. 3. At the positions from x2 to x9, the liquid path cross-sectional area changes from S3 (289 mm²) into S5 (1020 mm²). A position x3 denotes the position of the inlet of the cooling part 114. At the position x3, the liquid path cross-sectional area steeply changes from S5 (1020 mm²) into S4 (300 mm²). Likewise, a position x6 denotes the position of the outlet of the cooling part 114 in FIG. 3, a position x10 denotes the position of a liquid path cross-section 307, and a position x7 denotes the position of a liquid path cross-section 308. At the positions from x10 to x7, the liquid path cross-sectional area steeply changes from S5 (1020 mm²) into S3 (289 mm²).

Next, with reference to FIG. 5, the loss of pressure in the parts other than the cooling part when the liquid path structure according to this embodiment is used, will be described in comparison with the conventional example.

Figure 5:
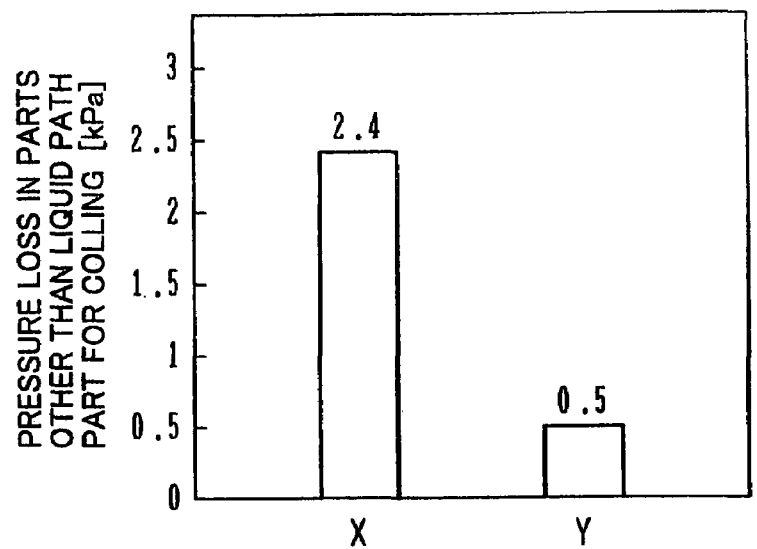
FIG. 5 is a diagram explaining the pressure loss value in the parts other than the cooling part when the liquid path structure used in the inverter apparatus according to the first embodiment is employed.

In FIG. 5, the pressure loss in the parts other than the cooling part when the liquid path structure used in the inverter apparatus according to the first embodiment of the present invention is employed, is shown with respect to the pressure loss in the conventional example. The ordinate axis denoted pressure loss value (kPa) in the parts other than the cooling part.

In FIG. 5, X represents a pressure loss value in the liquid path structure of the conventional example. Due to the existence of the partial structure parts 301 and 302 and the accumulating parts 303 and 304, a steep change occurs in the liquid path cross-sectional profile and cross-sectional area between these pipes, accumulating parts, and the cooling part 114. The pressure loss value in the parts other than the cooling part 114 shown in FIG. 3 was measured as 2.4 kPa.

This pressure loss value does not contribute to heat transmission at all. It is desirable to minimize the pressure loss value.

On the other hand, Y in FIG. 5 represents a pressure loss value in the case of the liquid path structure according to this embodiment. By gradually changing the partial structure pipes 113 and 115 in the width and depth directions of the liquid path, it is possible to avoid the occurrence of steep changes in the liquid path cross-sectional profile and cross-sectional area between the partial structure pipes 113 and 115 and the cooling part 114, and thereby to reduce the loss of pressure. The pressure loss value in the parts other than the cooling part 114 in this example was measured as 0.5 kPa. Thus, the pressure loss value in this embodiment can be reduced by a factor of about five, as compared with that of 2.4 kPa in the conventional example shown in FIG. 3. The pressure loss values of the cooling parts 114 shown in FIG. 2 (the present embodiment) and FIG. 3 (the conventional example) are the same, that is, the heat radiation capacities of the modules 100 are equal to each other.

As shown in FIG. 2, the partial structure pipe 113 is configured to gradually change in the width and depth directions of the liquid path, and therefore, even when the width W2 (=60 mm) of the cooling part is wide with respect to a feed tube (17 φ), it is possible to ensure a uniform flow rate of the cooling medium (cooling water) in the cooling part 114, and thereby to achieve uniform cooling. That is, according to the present embodiment, the loss of pressure can be reduced without deteriorating the heat transmission characteristic of the liquid path. This allows the size-reduction of the pump. Also, since the reduction in pressure loss enables the inverter to be cooled more efficiently, the size-reduction of the inverter can be implemented.

As described above, according to the present embodiment, in the liquid path extending from the feed pipe inlet up to the cooling part, there is provided a partial structure part having a cross-sectional profile that is gradually reduced in the short side direction of the cooling part and that is gradually enlarged in the long side direction thereof, and in the liquid path extending from the cooling part up to the drain pipe outlet, there is provided a partial structure part having a cross-sectional profile that is gradually enlarged from the short side of the cooling part and that is gradually reduced from the long side thereof. This makes it possible to achieve uniform cooling in the cooling part, thereby improving the thermal characteristic, and also to reduce the pressure loss in the parts other than the cooling part.

Next, the construction of an inverter apparatus according to a second embodiment of the present invention will be described with reference to FIG. 6. The overall construction of the liquid-cooling inverter according to this embodiment is the same as that shown in FIG. 1.

Figure 6:
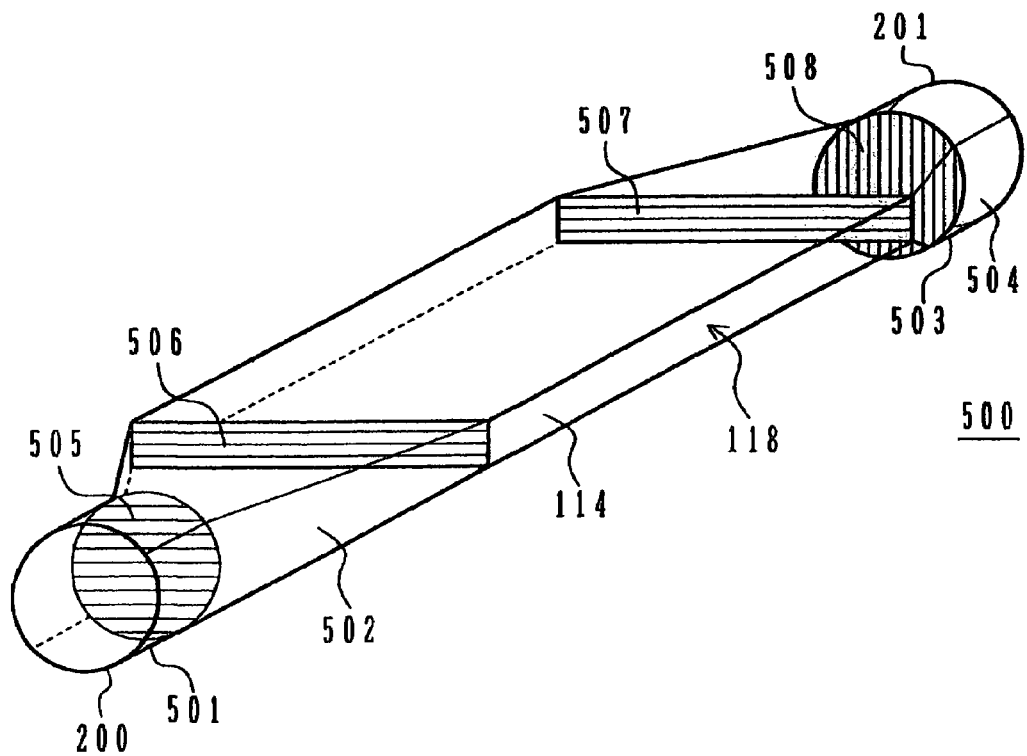
FIG. 6 is a perspective view showing the configuration of the liquid path in an inverter apparatus according to a second embodiment of the present invention.

FIG. 6 is a perspective view showing the configuration of the liquid path in the inverter apparatus according to the second embodiment. In FIG. 6, the same reference numerals denote the same parts as those in FIG. 2.

A feed pipe 501 and drain pipe 504 constituting a liquid path 500, respectively, are cylinders having the same diameters as those of the feed pipe inlet 200 and the drain pipe outlet 201. A partial structure part 502 is configured to be gradually enlarged from a liquid path cross-section 505 up to a liquid path cross-section 506 in the liquid path width direction, and gradually reduced in the liquid path depth direction. On the other hand, a partial structure part 503 is configured to be gradually reduced from a liquid path cross-section 507 up to a liquid path cross-section 508 in the liquid path width direction, and gradually enlarged in the liquid path depth direction. The partial structure parts 502 and 503 may have a nested configuration, or alternatively may be a combination of a half cylinder and a rectangular parallelepiped by providing an opening part only on the surface bordering on the module.

In this embodiment, the pressure loss value can be reduced more than the case in the structure shown in FIG. 2. This is because a feed pipe 501 has a circular cross-section with the same diameter as that of the feed pipe connected to the radiator, thereby causing no loss of pressure in this part, and because the partial structure part 502 has a structure has a cross-section that is gradually changed, thereby reducing the loss of pressure. The pressure loss value in the parts other than the cooling part 114 was measured as 0.3 kPa. Thus, the present liquid path structure can make the pressure loss value lower than the pressure loss value of 0.5 kPa in the structure shown in FIG. 2. This allows the size-reduction of the pump or inverter to be implemented.

As described above, according to the present embodiment, by providing respective partial structure parts in the liquid path extending from the feed pipe inlet up to the cooling part, and in the liquid path extending from the cooling part up to the drain pipe outlet, it is possible to achieve uniform cooling in the cooling part, thereby improving the thermal characteristic, and also to reduce the pressure loss in the parts other than the cooling part. Furthermore, by forming each of the feed pipe and drain pipe into a cylindrical shape, the loss of pressure can be more reduced.

Next, the construction of the inverter apparatus according to a third embodiment of the present invention will be described with reference to FIGS. 7A to 7C.

Figure 7A:
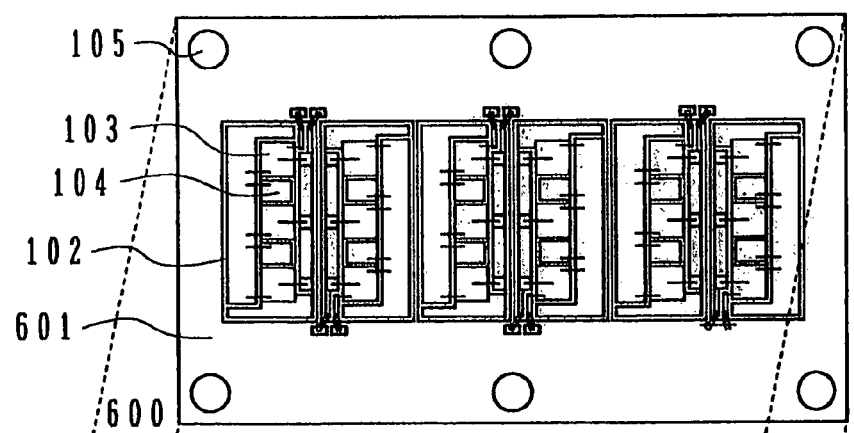
FIG. 7A is a plan view showing a module of an inverter apparatus according to a third embodiment of the present invention.
Figure 7B:
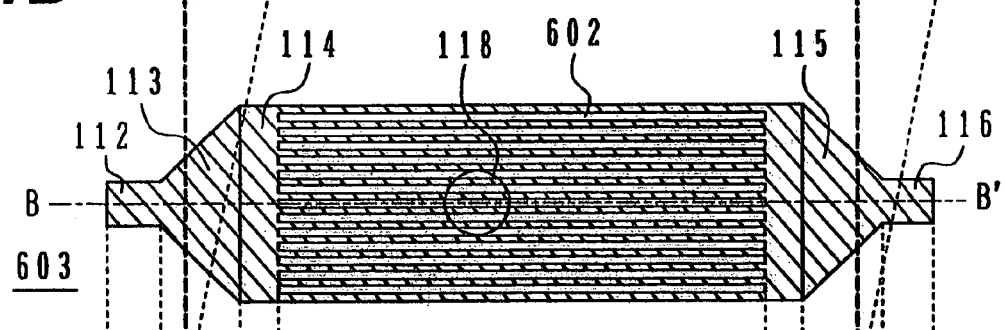
FIG. 7B is a perspective plan view showing the liquid path part of this inverter apparatus.

FIG. 7A is a plan view showing a module with six arms (upper and lower arms in each of the U, V, and W phases) of an inverter apparatus according to the third embodiment, and FIG. 7B is a perspective plan view showing the liquid path part of the inverter apparatus according to this embodiment.

Figure 7C:
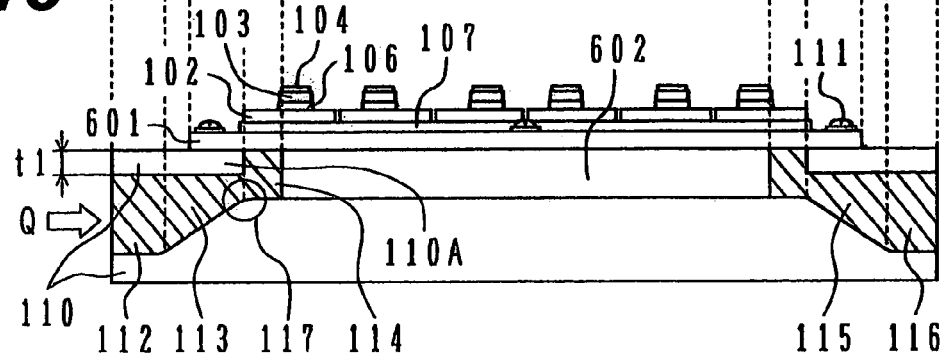
FIG. 7C is a sectional view showing the overall construction of the inverter apparatus.

FIG. 7C is a sectional view showing the overall construction of the inverter apparatus according to this embodiment, the sectional view being taken along the line B-B' in FIG. 7B. In FIG. 7A to 7C, the same reference numerals denote the same parts as those in FIG. 1.

The inverter apparatus according to this embodiment is used as a water-cooling inverter having the configuration of a base-direct-cooling module with fins. Specifically, fins 602 are integrally formed with a copper base 601. An opening part is formed at the center of the upper part of the case 110. A liquid path 603 is formed by inserting the fins 602 into the aforementioned opening part, and fastening a module 600 to the case 110 using screws 111. The size of the fins 602 is equivalent to that of the fins 109 shown in FIG. 1. In this manner, by forming the fins 602 integrally with the copper base 601, the inverter apparatus according to this embodiment can improve the cooling efficiency as a direct cooling system that directly applies cooling water to the module 600. In general, the module 600 is prevented from water leakage from the liquid path to the high voltage part thereof by screwing and an O-ring (not shown). However, the module may instead be prevented from being covered with water by welding or FSW (Friction Stirring Welding).

The liquid path parts 112, 113, 114, 115, and 116 are substantially the same as those shown in FIGS. 1 and 2, in which the liquid path parts 113 and 115 are provided as partial structure parts. As a result of forming the liquid path using the copper base 601, the width of the liquid path becomes narrowed by one plate thickness t1 (e.g., 2 mm) at the end part 110A adjacent to the central part of the upper plate of the case 110, there is a risk of causing a loss of pressure. Therefore, a round corner R117 is provided at the part corresponding to the end part 110A in order to reduce the pressure loss.

In the liquid path structure having the shape shown in FIG. 7, the pressure loss value in the parts other than the cooling part 114 was measured as 0.6 kPa. Although the pressure loss value in this case is higher by about 0.1 kPa than that in the structure shown in FIG. 2, the present liquid path structure can reduce the pressure loss value with respect to the conventional structure. This allows the size-reduction of the pump or inverter. In addition, it is recognized that the adoption of the direct cooling system improves the cooling efficiency.

As described above, according to the present embodiment, by providing respective partial structure parts in the liquid path extending from the feed pipe inlet up to the cooling part, and in the liquid path extending from the cooling part up to the drain pipe outlet, it is possible to achieve uniform cooling in the cooling part, thereby improving the thermal characteristic, and also to reduce the pressure loss in the parts other than the cooling part. Furthermore, by adopting the direct cooling system, the cooling efficiency can be improved.

Next, the construction of the inverter apparatus according to a fourth embodiment of the present invention will be described with reference to FIGS. 8A to 8C.

FIG. 8A is a plan view showing a module with six arms (upper and lower arms in each of the U, V, and W phases) of an inverter apparatus according to the fourth embodiment of the present invention, and FIG. 8B is a perspective plan view showing the liquid path part of the inverter apparatus according to this embodiment. FIG. 8C is a sectional view showing the overall construction of the inverter apparatus according to this embodiment, the sectional view being taken along the line C-C' in FIG. 8B. In FIG. 8A to 8C, the same reference numerals denote the same parts as those in FIG. 1.

The inverter apparatus according to this embodiment is used as a water-cooling inverter having the configuration of a base-direct-cooling module without fins. Specifically, the copper base 100 is a flat plate without fins. The constructions other than the copper base 100 is the same as those shown in FIG. 6. As a cooling system, a direct cooling system is used also in the case. A liquid path 700 is formed by joining the module 100 to the case 110 by screwing or welding. The liquid path depth H6 in a cooling part 701 is. e.g., approximately 2 mm. When the flow rate is 20 liters per minute, the flow speed in the cooling part 701 is approximately 2.5 m/s.

In the liquid path structure having the shape shown in FIG. 8, the pressure loss value in the parts other than the cooling part 114 was measured as 1 kPa. Although the pressure loss value in this case is higher than the structure shown in FIG. 7, the present liquid path structure can reduce the pressure loss value with respect to the conventional structure. This allows the size-reduction of the pump or inverter. In addition, it is recognized that the adoption of the direct cooling system improves the cooling efficiency.

As described above, according to the present embodiment, by providing respective partial structure parts in the liquid path extending from the feed pipe inlet up to the cooling part, and in the liquid path extending from the cooling part up to the drain pipe outlet, it is possible to achieve uniform cooling in the cooling part, thereby improving the thermal characteristic, and also to reduce the pressure loss in the parts other than the cooling part. Furthermore, the cooling efficiency can be improved by adopting the direct cooling system.

Next, the construction of the inverter apparatus according to a fifth embodiment of the present invention will be described with reference to FIGS. 9A and 9B.

FIG. 9A is a perspective plan view showing the liquid path part of the inverter apparatus according to this embodiment. FIG. 9B is a sectional view showing the overall construction of the inverter apparatus according to this embodiment, the sectional view being taken along the line D-D' in FIG. 9A. In FIGS. 9A and 9B, the same reference numerals denote the same parts as those in FIG. 1.

The inverter according to this embodiment is a two-inverter system having liquid paths that are connected end to end parallel with each other. The planar configuration of the inverter apparatus according to this embodiment is similar to that shown in FIG. 1A, but in this embodiment, two modules are arranged in series on the same plane in the liquid path flow direction.

In a liquid path 800, the cooling water flows from a pre-stage cooling part 114 toward a post-stage cooling part 802 through liquid path 801. The size of fins 803 is equivalent to that of the fins 109. The fins 109 and fins 803 may be integrally connected with each other in midway. The feed and drain pipes 112 and 116 may each be disposed substantially perpendicularly to the cooling part 114.

When the cooling water was fed at a flow rate of 20 liters per minute, the pressure loss in the other parts other than the cooling parts 114 and 802 was measured as 1.5 kPa. This is because the pressure loss in the liquid path 801 part is large. However, when the conventional structure shown in FIG. 3 was applied to a two-inverter type, the pressure loss value thereof was found to be 3.4 kPa, and therefore, it can be seen that the present liquid path structure can reduce the pressure loss with respect to the conventional structure. Meanwhile, when the flow rate is likely to exceed the supply capacity of the pump, the flow rate should be reduced to one corresponding to the permissible upper limit of pressure loss. In the present structure also, the size-reduction of the inverter can be implemented. Here, as a liquid-cooling system, an indirect cooling system is used, but a direct cooling system as shown in FIGS. 7A to 7C and FIGS. 8A to 8C may instead be employed.

As described above, according to the present embodiment, by providing respective partial structure parts in the liquid path extending from the feed pipe inlet up to the cooling part, and in the liquid path extending from the cooling part up to the drain pipe outlet, it is possible to achieve uniform cooling in the cooling part, thereby improving the thermal characteristic, and also to reduce the pressure loss in the parts other than the cooling part.

Next, the construction of the inverter apparatus according to a sixth embodiment of the present invention will be described with reference to FIGS. 10A and 10B.

Figure 10A:
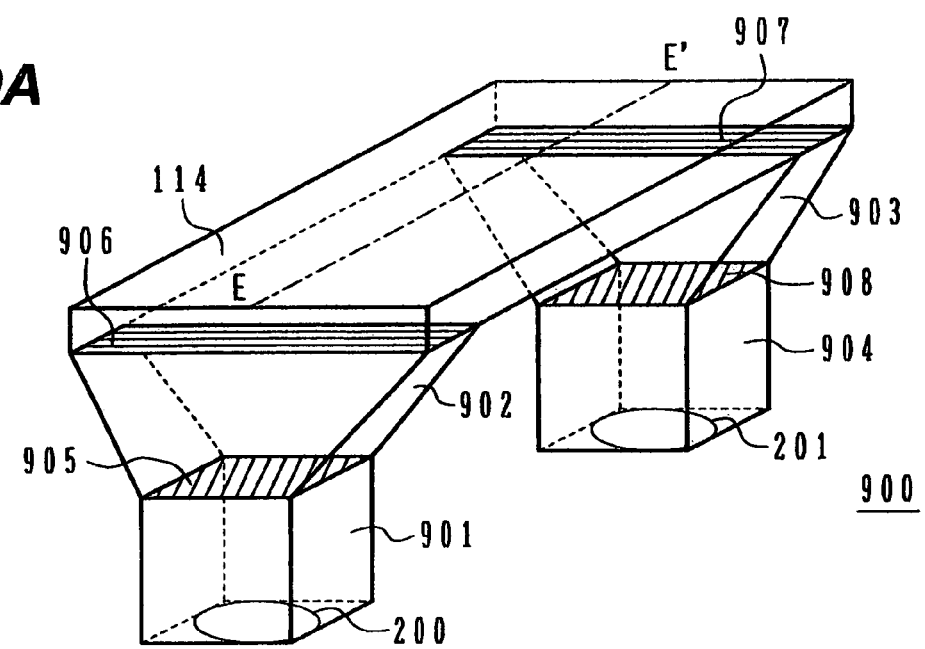
FIG. 10A is a perspective view showing the liquid path part of an inverter apparatus according to a sixth embodiment of the present invention.

FIG. 10A is a perspective view showing the liquid path part of the inverter apparatus according to this embodiment.

Figure 10B:
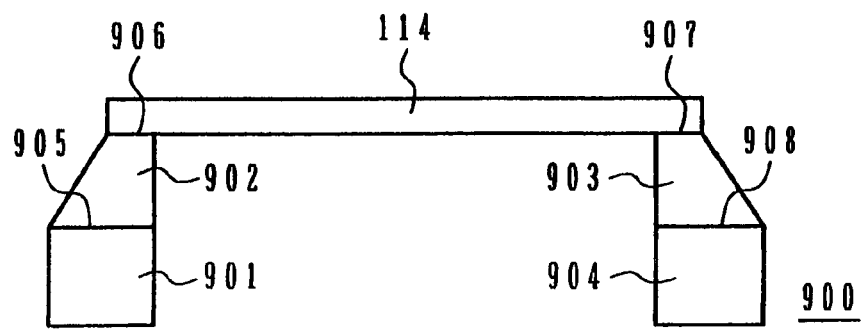
FIG. 10B is a sectional view showing the overall construction of this inverter apparatus.

FIG. 10B is a sectional view showing the liquid path part of the inverter apparatus according to this embodiment, the sectional view being taken along the line E-E' in FIG. 10A.

In FIGS. 10A and 10B, the same reference numerals denote the same parts as those in FIG. 1.

In this embodiment, the feed and drain pipes are each disposed substantially perpendicularly to the cooling part, and generally, the water pipe cross-sectional profile from the feed pipe up to the cooling part is gradually reduced in the short-side direction of the connecting cross-section between the partial structure part and the cooling part, and is gradually enlarged in the long-side direction thereof. On the other hand, generally, the water pipe cross-sectional profile from the cooling part up to the drain pipe is gradually enlarged from the short-side of the connecting cross-section between the cooling part and the partial structure part, and is gradually reduced from the long-side thereof.

In the construction shown in FIG. 10, the parts other than the liquid path 900 are the same as those in FIG. 1. The feed pipe 901 and the drain pipe 904 are each disposed substantially perpendicularly to the cooling part 114. Between the feed pipe 901 and the cooling part 114, there is provided a partial structure part 902 that is enlarged from the liquid path cross-section 905 up to the liquid path cross-section 906 in the liquid path width (long-side) direction, and that is reduced in the liquid path depth (short-side) direction. Likewise, between the cooling part 114 and the drain pipe 904, there is provided a partial structure part 903 that is reduced from the liquid path cross-section 907 up to the liquid path cross-section 908 in the liquid path width (long-side) direction, and that is enlarged in the liquid path depth (short-side) direction.

In the liquid path structure having the shape shown in FIG. 10, the pressure loss value in the parts other than the cooling part 114 was measured as 1.7 kPa. Thus, the present liquid path structure can reduce the pressure loss value by about 30% than the conventional structure shown in FIG. 3. This enables the size-reduction of the pump or the inverter to be realized. Also, disposing the feed pipe side and the drain pipe side perpendicularly to the cooling part allows the area of the liquid-cooling inverter to become smaller than that of the conventional structure, resulting in a size-reduced inverter. In addition, because the feed and drain pipes are located on the same side with respect to the inverter, a high degree of flexibility in design is provided.

As described above, according to the present embodiment, by providing respective partial structure parts in the liquid path extending from the feed pipe inlet up to the cooling part, and in the liquid path extending from the cooling part up to the drain pipe outlet, it is possible to achieve uniform cooling in the cooling part, thereby improving the thermal characteristic, and also to reduce the pressure loss in the parts other than the cooling part.

Next, the construction of the inverter apparatus according to a seventh embodiment of the present invention will be described with reference to FIGS. 11A and 11B.

Figure 11A:
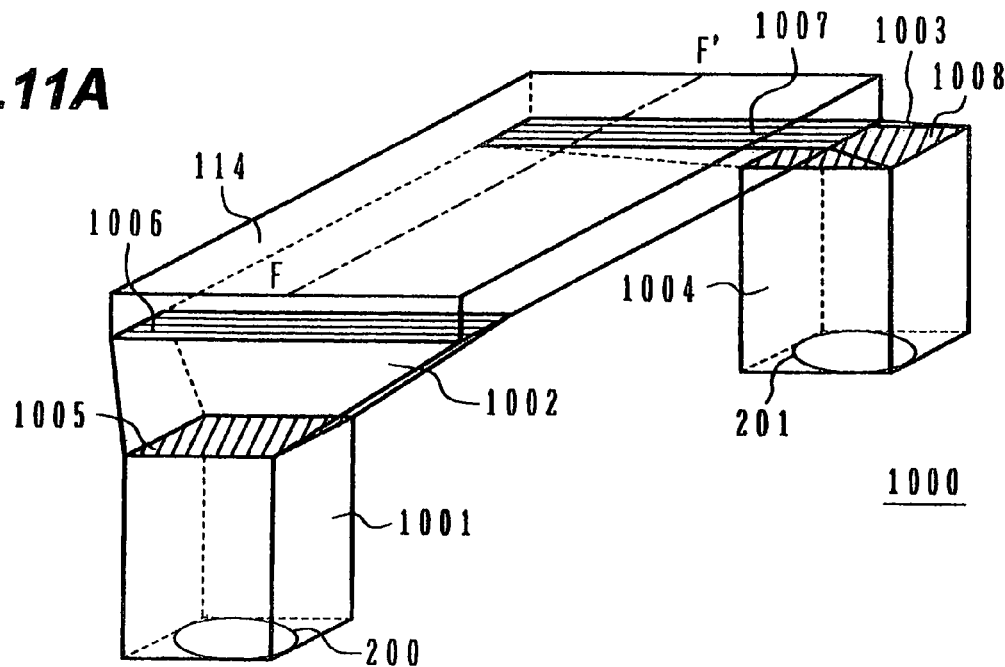
FIG. 11A is a perspective view showing the liquid path part of an inverter apparatus according to a seventh embodiment of the present invention.

FIG. 11A is a perspective view showing the liquid path part of the inverter apparatus according to this embodiment.

Figure 11B:
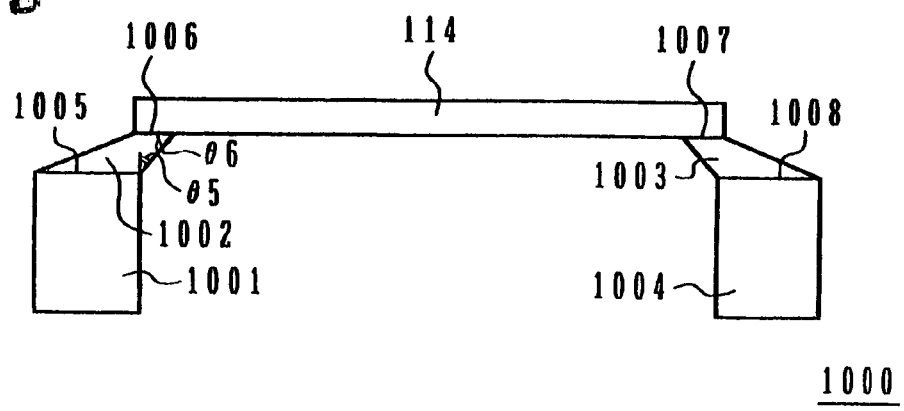
FIG. 11B is a sectional view showing the overall construction of this inverter apparatus.

FIG. 11B is a sectional view showing the liquid path part of the inverter apparatus according to this embodiment, the sectional view being taken along the line F-F' in FIG. 11A.

In FIGS. 11A and 11B, the same reference numerals denote the same parts as those in FIG. 1.

As in the case of the sixth embodiment shown in FIGS. 10A and 10B, in the present embodiment, the feed and drain pipes are each disposed substantially perpendicularly to the cooling part. The constructions other than the construction of a liquid path 1000 is the same as those in FIG. 1. Each of the feed pipe 1001 and the drain pipe 1004 is substantially normal to the cooling part 114, as described above. Between the feed pipe 1001 and the cooling part 114, there is provided a partial structure part 1002 that is enlarged from the liquid path cross-section 1005 up to the liquid path cross-section 1006 in the liquid path width direction, and that is reduced in the liquid path depth direction. Likewise, between the cooling part 114 and the drain pipe 1004, there is provided a partial structure part 1003 that is reduced from the liquid path cross-section 1007 up to the liquid path cross-section 1008 in the liquid path width direction, and that is enlarged in the liquid path depth direction.

The present embodiment is different from the sixth embodiment shown in FIG. 10 in the angle of the peripheral wall of each of the partial structure parts 1002 and 1003 with respect to the cooling part 114. Specifically, the angle θ5 formed between the peripheral wall of the feed pipe 1001 and that of the partial structure part 1002 is 45 degrees. Also, the angle θ6 formed between the peripheral wall of the partial structure part 1002 and that of the cooling part 114 is 45 degrees. Thereby, the cooling water entered in the feed pipe inlet 200 turns the flow direction thereof by an angle of approximately 45 degrees between the feed pipe 1001 and the partial structure part 1002, and further, it turns the flow direction thereof by an angle of approximately 45 degrees between the partial structure part 1002 and the cooling part 114, thus flowing into the cooling part 114. Likewise, with regard to the drain pipe side, the cooling water turns the flow direction thereof by an angle of approximately 45 degrees between the cooling part 114 and the partial structure part 1003, and further, it turns the flow direction thereof by an angle of approximately 45 degrees between the partial structure part 1003 and the drain pipe 1004, thus flowing out from the drain pipe outlet 201.

As described above, in this embodiment, by dividing the change (vector change) in the flow direction between the feed and drain pipes 1001 and 1004 and the cooling part 114 into two steps, and setting one-step vector change to 45 degrees, the occurrence of pressure loss caused by a steep vector change is prevented. It is desirable that the angle θ5 formed between the peripheral wall of the feed pipe 1001 and that of the partial structure part 1002 be not more than 45 degrees. Also, it is desirable that the angle θ6 formed between the peripheral wall of the feed pipe 1002 and that of the cooling part 114 be less than 45 degrees.

In the present embodiment, the pressure loss value in the parts other than the cooling part 114 was measured as 1.1 kPa. Thus, the present liquid path structure can reduce the pressure loss value with respect to the example shown in FIG. 10. Also, disposing the feed pipe side and the drain pipe side perpendicularly to the cooling part allows the area of the liquid-cooling inverter to be smaller than that of the conventional structure, resulting in a size-reduced inverter. In addition, because the feed and drain pipes are located on the same side with respect to the inverter, a higher degree of flexibility in design is provided.

As described above, according to the present embodiment, by providing respective partial structure parts in the liquid path extending from the feed pipe inlet up to the cooling part, and in the liquid path extending from the cooling part up to the drain pipe outlet, it is possible to achieve uniform cooling in the cooling part, thereby improving the thermal characteristic, and also to reduce the pressure loss in the parts other than the cooling part.

Next, the construction of the inverter apparatus according to an eighth embodiment of the present invention will be described with reference to FIGS. 12A and 12B.

Figure 12A:
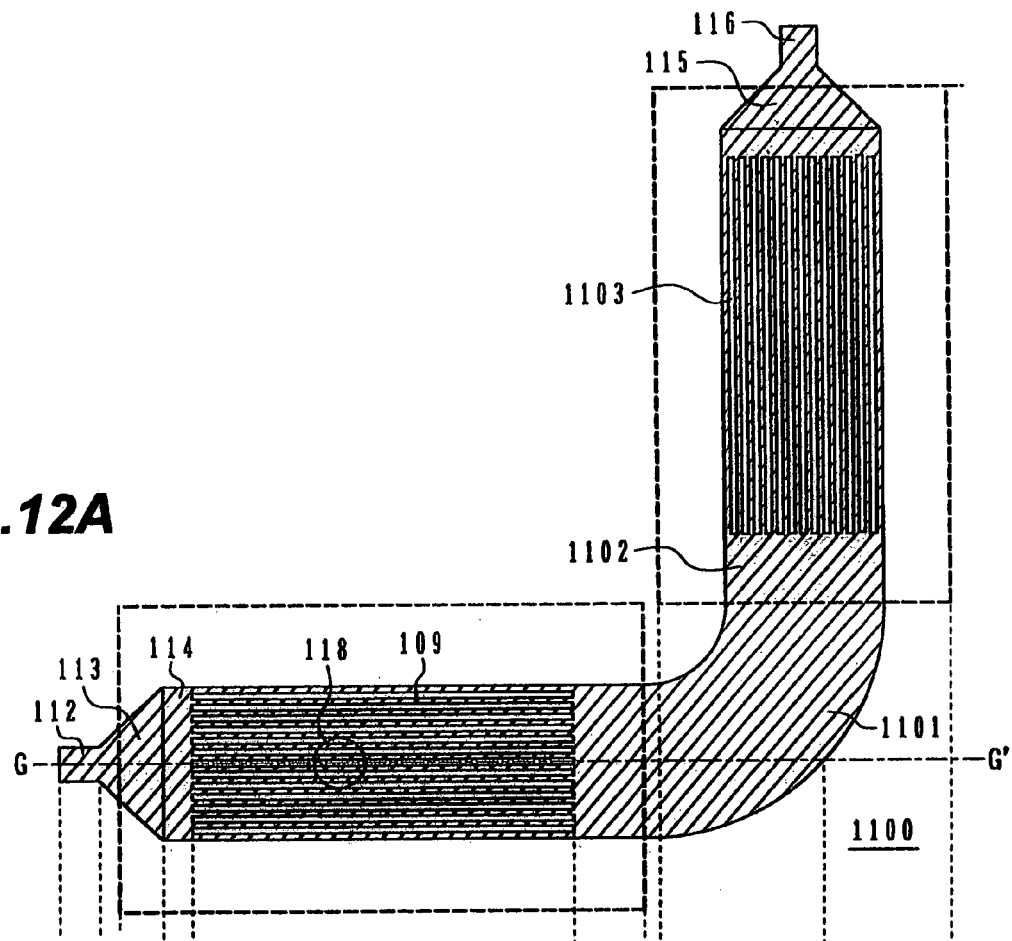
FIG. 12A is a perspective plan view showing the liquid path part of an inverter apparatus according to an eighth embodiment of the present invention.
Figure 12B:
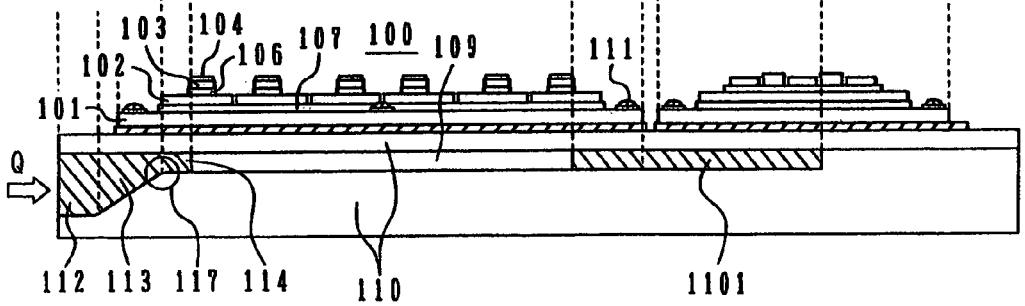
FIG. 12B is a sectional view showing the overall construction of this inverter apparatus.

FIG. 12A is a perspective plan view showing the liquid path part of the inverter apparatus according to this embodiment. FIG. 12B is a sectional view showing the overall construction of the inverter apparatus according to this embodiment, the sectional view being taken along the line G-G' in FIG. 12A. In FIGS. 12A and 12B, the same reference numerals denote the same parts as those in FIG. 1.

The inverter according to this embodiment is a two-inverter system having liquid paths that are serially connected into an L-shape. The planar configuration of the inverter apparatus according to this embodiment is similar to that shown in FIG. 1A, but in this embodiment, two modules exist on the same plane. In a liquid path 1100, two modules are arranged in series in the flow direction, and form a substantially L-shape between the two inverters.

In the liquid path 1100, the cooling water flows from a pre-stage cooling part 114 toward a post-stage cooling part 1102 through a liquid path 1101. The size of fins 1103 is equivalent to that of the fins 109. The fins 109 and fins 1103 may be integrally connected with each other in midway.

The feed and drain pipes 112 and 116 and the partial structure parts 113 and 115 may each be disposed substantially perpendicularly to the cooling part 114. Here, as a liquid-cooling system, an indirect cooling system is used, but a direct cooling system as shown in FIGS. 7A to 7C and FIGS. 8A to 8C may instead be employed.

When the cooling water was fed at a flow rate of 20 liters per minute, the pressure loss in the other parts other than the cooling parts 114 and 1102 was measured as 3.2 kPa. Thus, the present liquid path structure can reduce the pressure loss with respect to the case where the conventional structure is applied to the two-inverter type shown in FIG. 3. Meanwhile, when the flow rate is likely to exceed the supply capacity of the pump, the flow rate should be reduced to one corresponding to the permissible upper limit of pressure loss. In the present liquid path structure also, the size-reduction of the inverter can be implemented.

As described above, according to the present embodiment, by providing respective partial structure parts in the liquid path extending from the feed pipe inlet up to the cooling part, and in the liquid path extending from the cooling part up to the drain pipe outlet, it is possible to achieve uniform cooling in the cooling part, thereby improving the thermal characteristic, and also to reduce the pressure loss in the parts other than the cooling part.

Next, the construction of the inverter apparatus according to a ninth embodiment of the present invention will be described with reference to FIGS. 13A and 13B.

Figure 13A:
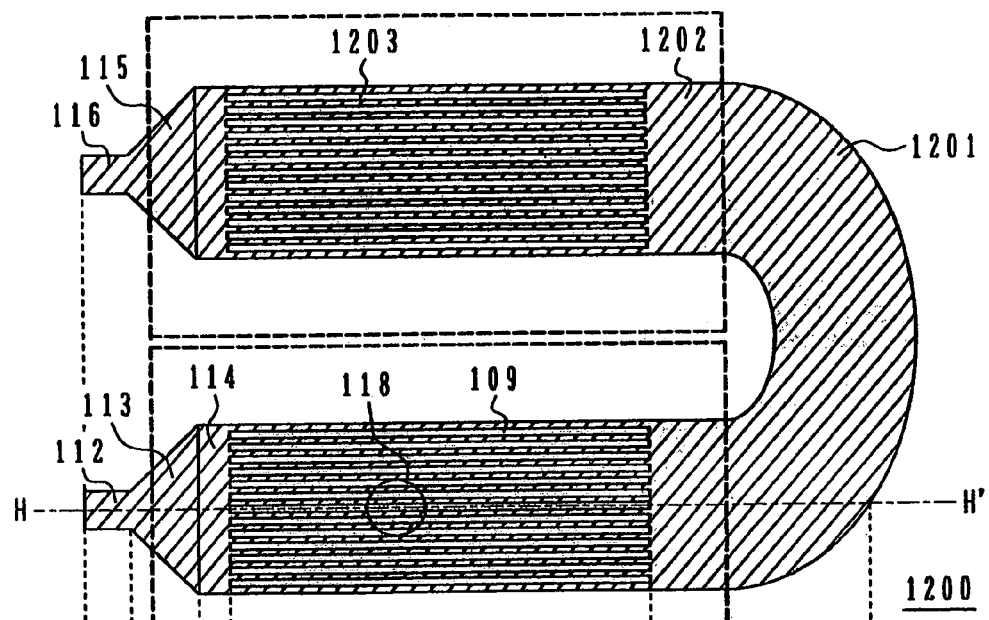
FIG. 13A is a perspective plan view showing the liquid path part of an inverter apparatus according to a ninth embodiment of the present invention.
Figure 13B:
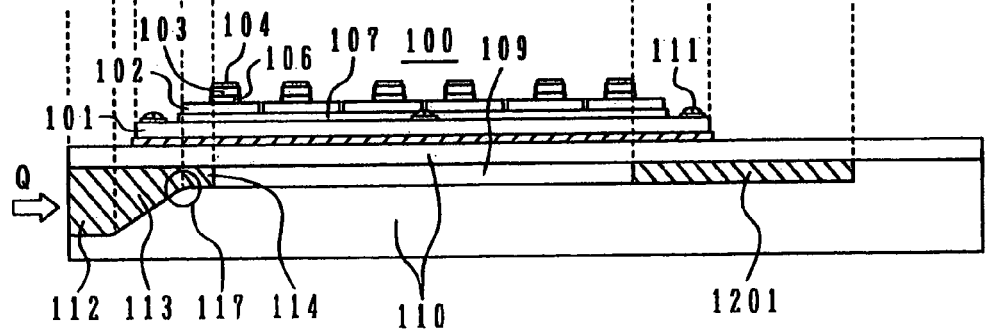
FIG. 13B is a sectional view showing the overall construction of this inverter apparatus.

FIG. 13A is a perspective plan view showing the liquid path part of the inverter apparatus according to this embodiment. FIG. 13B is a sectional view showing the overall construction of the inverter apparatus according to this embodiment, the sectional view being taken along the line H-H' in FIG. 13A. In FIGS. 13A and 13B, the same reference numerals denote the same parts as those in FIG. 1.

The inverter according to this embodiment is a two-inverter system having liquid paths that are serially connected into a U-shape. The planar configuration of the inverter apparatus according to this embodiment is similar to that shown in FIG. 1A, but in this embodiment, two modules exist on the same plane. In a liquid path 1200, two modules are arranged in series in the flow direction, and form a substantially U-shape between the two inverters.

In the liquid path 1200, the cooling water flows from a pre-stage cooling part 114 toward a post-stage cooling part 1202 through a liquid path 1201. The size of fins 1203 is equivalent to that of the fins 109. The fins 109 and fins 1203 may be integrally connected with each other in midway. The feed and drain pipes 112 and 116 and the partial structure parts 113 and 115 may each be disposed substantially perpendicularly to the cooling part 114. Here, as a liquid-cooling system, an indirect cooling system is used, but a direct cooling system as shown in FIGS. 7A to 7C and FIGS. 8A to 8C may instead be employed.

When the cooling water was fed at a flow rate of 20 liters per minute, the pressure loss in the other parts other than the cooling parts 114 and 1202 was measured as 4.2 kPa. Thus, the present liquid path structure can reduce the pressure loss with respect to the case where the conventional structure is applied to the two-inverter type shown in FIG. 3. Meanwhile, when the flow rate is likely to exceed the supply capacity of the pump, the flow rate should be reduced to one corresponding to the permissible upper limit of pressure loss. In the present liquid path structure also, the size-reduction of the inverter can be implemented.

As is evident from the foregoing, according to the present embodiment, by providing respective partial structure parts in the liquid path extending from the feed pipe inlet up to the cooling part, and in the liquid path extending from the cooling part up to the drain pipe outlet, it is possible to achieve uniform cooling in the cooling part, thereby improving the thermal characteristic, and also to reduce the pressure loss in the parts other than the cooling part.

Figure 14:
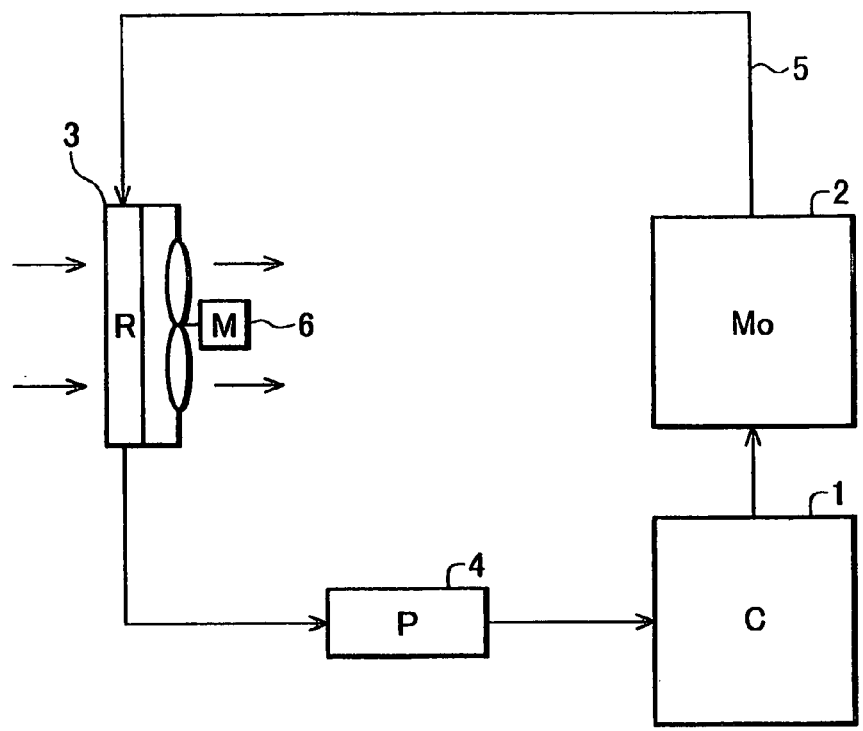
FIG. 14 is a block diagram of a cooling system for a controller (inverter apparatus) and electric motor of an electric vehicle incorporating any of the above-described inverter apparatuses.

FIG. 14 shows a cooling system for a controller (inverter apparatus) and electric motor of an electric vehicle, such as an electric car or hybrid car, incorporating any of the above-described inverter apparatuses. The cooling system is formed by connecting, using a cooling pipe 5, an electric motor 2 for driving an axle, a controller 1 (inverter apparatus) for controlling the output of the electric motor 2, a radiator 3 for cooling a cooling medium, and an electric pump 4. An antifreeze solution as a cooling medium is sealed in the cooling pipe 5. A radiator fan motor 6 for forcibly cooling the cooling medium is attached to the side surface of the radiator 3. In the above-described construction, the amount of heat generated by the controller 1 (inverter apparatus) and that generated by the electric motor 2 are substantially the same. However, the heating value of electronic components, such as transistors, capacitors and the like, constituting the controller 1 (inverter apparatus) is as high as 150 degrees. Such a thermal environment is very hostile for these electronic components having low heat-resistance. Therefore, the system is configured so that the controller 1 (inverter apparatus) is given a higher precedence over the electric motor 2 in the cooling order, and the electric motor 2 having higher heat-resistance is cooled after the controller 1 (inverter apparatus), in order to achieve effective cooling with thermal balance improved.

According to the present embodiment, since there is provided any one of the above-described inverter apparatuses, that is, an inverter apparatus capable of reducing the loss of pressure, the electric pump 4, which forcibly circulates an antifreeze solution or water as a cooling medium, can be reduced in capacity, that is, the electric pump 4 can be reduced in size. According to this embodiment, therefore, an inexpensive cooling system can be provided.

Figure 15:
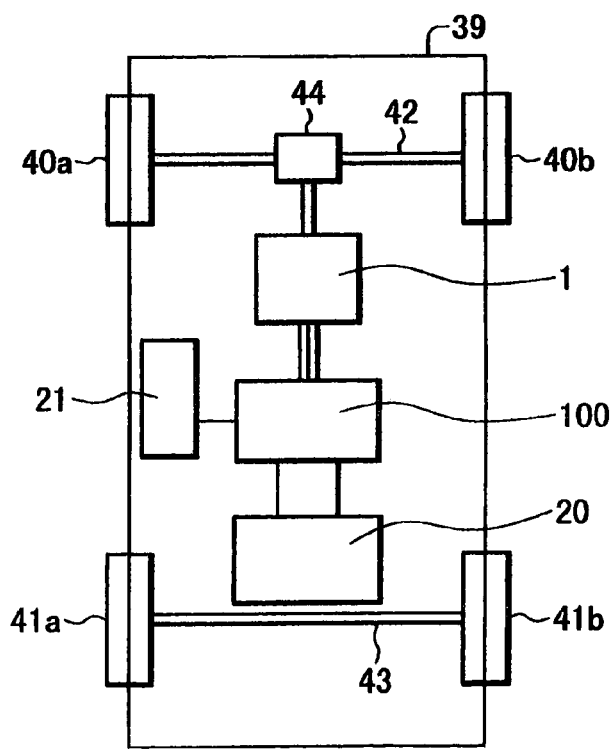
FIG. 15 is a plan view of the construction of an electrical apparatus drive system equipped with the above-described cooling system.

FIG. 15 shows the construction of an electrical apparatus drive system equipped with the above-described cooling system. In this embodiment, the case where any one of the above-described inverter apparatuses is mounted on an electric car, which uses an electric motor as the only one driving source, is taken as an example. However, any one of the above-described inverter apparatuses may instead be applied to a hybrid car, which uses an engine as an internal-combustion engine and an electric motor, as driving sources for the vehicle.

In FIG. 15, reference numeral 39 denotes a car body. An axle 42 having wheels 40a and 40b provided at the opposite ends thereof is rotatably installed to the front part of the car body 39. Namely, front wheels are fixed to the front part of the car body 39. An axle 43 having wheels 41a and 41b provided at the opposite ends thereof is rotatably installed to the rear part of the car body 39. Namely, rear wheels are fixed to the rear part of the car body 39. An electric motor 2 is mechanically connected to the axle 42 via a gear 44. An inverter apparatus 100 is electrically connected to the electric motor 2. Direct-current power supplied from a battery 20 as a vehicle power source is converted by the inverter apparatus 100 into three-phase alternating-current power, and is supplied to the electric motor 2. A higher-level control unit 21 is electrically connected to the inverter apparatus 100, and inputs the command signal corresponding to an accelerator pedal depression amount into the inverter apparatus 100.

According to the present embodiment, since there is provided any one of the above-described inverter apparatuses, that is, an inverter apparatus capable of reducing the loss of pressure, the electric pump 4, which constitutes a cooling system for cooling the inverter apparatus, can be reduced in capacity, that is, the electric pump 4 can be reduced in size. According to this embodiment, therefore, an inexpensive cooling system can be provided. This improves the mountability of the cooling system onto the electric vehicle, and contributes to the reduction of the production cost of the electric vehicle.

According to the present invention, uniform cooling allows to be achieved without the need for accumulating parts, thereby improving thermal characteristic, and also enables the pressure loss in the parts other than the cooling part to be reduced.

While the present invention has been described with reference to what are at present considered to be the preferred embodiments, it is to be understood that various changes and modifications may be made thereto without departing from the present invention in its broader aspects and therefore, it is intended that the appended claims cover all such changes and modifications that fall within the true spirit and scope of the invention.

The invention claimed is:

1. A direct cooling inverter comprising:
   a plurality of semiconductor chips;
   a substrate for mounting said plurality of semiconductor chips;
   a copper base for mounting said substrate;
   a fin formed integrally with said copper base; and
   a case having an opening part;
   wherein a liquid path of a cooling medium is formed by mounting said copper base on the opening part of said case;
   wherein said copper base and said fin are directly cooled by the cooling medium;
   wherein said fin is formed in parallel with a longitudinal direction of the liquid path;
   wherein the liquid path comprises a cooling part formed at a bottom of said plurality of semiconductor chips and an introducing part for introducing the cooling medium supplied from an outside to the cooling part; and
   wherein a cross-sectional area of the liquid path extending from the introducing part up to the cooling part is substantially constant.

2. The direct cooling inverter according to claim 1, wherein a width of the liquid path at the introducing part is smaller than that of the liquid path at the cooling part, wherein a depth of the liquid path at the introducing part is larger than that of the liquid path at the cooling part, and wherein the width and the depth of the liquid path are gradually changed from the introducing part to the cooling part.

3. The direct cooling inverter according to claim 2, wherein there is no accumulating part between the introducing part and the cooling part of the liquid path.

4. The direct cooling inverter according to claim 3, wherein a width of the liquid path at the draining part is smaller than that of the liquid path at the cooling part, wherein a depth of the liquid path at the introducing part is larger than that of the liquid path at the cooling part, and wherein the width and the depth of the liquid path are gradually changed from the introducing part to the cooling part.

5. The direct cooling inverter according to claim 4, wherein a cross-section of the liquid path at the introducing part is circular.

6. The direct cooling inverter according to claim 5, wherein a diameter of the liquid path at the introducing part is substantially the same as that of a feed pipe connected to a radiator.

7. The direct cooling inverter according to claim 4, wherein said plurality of semiconductor chips comprise an insulated gate bipolar transistor, and wherein the insulated gate bipolar transistor supplies AC power to a motor and drives the motor by switching based on a control signal.

8. The direct cooling inverter according to claim 2, wherein said copper base and said case are fastened by using screws.

9. The direct cooling inverter according to claim 2, wherein said copper base and said case are welded.

10. The direct cooling inverter according to claim 1, wherein the liquid path comprises a draining part for draining the cooling medium introduced from the cooling part to the outside, and wherein the cross-sectional area extending from the cooling part up to the draining part is substantially constant.

* * * * *